(12) United States Patent
Cho

(10) Patent No.: US 6,444,995 B1
(45) Date of Patent: Sep. 3, 2002

(54) FOCUSSING METHOD AND SYSTEM OF EXPOSURE APPARATUS

(75) Inventor: Jun-Geol Cho, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/481,492

(22) Filed: Jan. 12, 2000

(30) Foreign Application Priority Data

Jan. 22, 1999 (KR) .............................................. 99-01985

(51) Int. Cl.[7] .............................................. G01N 21/86
(52) U.S. Cl. ........................ 250/548; 250/201.2; 355/55
(58) Field of Search ........................... 250/548, 559.29, 250/559.3, 201.2; 356/399, 400, 401; 355/53, 55, 68

(56) References Cited

U.S. PATENT DOCUMENTS 6,094,268 A * 7/2000 Oshida et al. ............... 250/548
6,107,637 A * 8/2000 Watanabe et al. ........... 250/548
6,130,751 A * 10/2000 Haginiwa et al. ........... 250/548

* cited by examiner

*Primary Examiner*—Kevin Pyo
(74) *Attorney, Agent, or Firm*—Volentine Francos, PLLC

(57) ABSTRACT

A focussing method and system transmits a light for measuring a focus to a semiconductor wafer at a fixed incident angle having high reflectance and detects a light reflected at a surface of a photoresist layer on the semiconductor wafer. The light is transmitted at an incident angle such that the amount of light reflected from the surface of the photoresist layer is larger than the amount of light which penetrates the surface thereof. The reflected light is detected, and the position of the semiconductor wafer is controlled in response to the amount of light detected. The focussing system has a source part, a detection part, and a control part. The source part creates the light and then transmits the light to the surface of the photoresist layer. The detection part detects the amount of reflected light and generates a detection signal corresponding thereto. The control part controls the position of the semiconductor wafer in response to the detection signal generated at the detection part.

8 Claims, 5 Drawing Sheets

FOCUSSING METHOD AND SYSTEM OF EXPOSURE APPARATUS

BACKGROUND OF THE INVENTION

1. Field of the Invention

This invention relates to an exposure apparatus of the step-and-repeat or step-and-scan type and, more particularly, to a focussing method and system for controlling focussing and levelling between a substrate and an optical system of an exposure apparatus that is used to produce semiconductor elements and liquid crystal elements.

2. Background of the Related Art

In a step-and-repeat or step-and-scan exposure apparatus, images of circuit patterns, drawn on a master plate, are transferred to a photoresist layer of a semiconductor wafer and are developed to obtain a desired photoresist pattern.

In the general manufacture of semiconductor elements, multiple layers of circuit patterns are laminated. Therefore, it is necessary to accurately align an optical image of a circuit pattern, to which exposure is to be made, to a circuit pattern already formed on a wafer. In order to ensure accurate patterning, an exposure apparatus is essential for providing a fixed focus ("focussing") from a reduced projection lens of an optical system to a surface of a wafer, as well as providing "levelling" of the fixed focus area. Conventionally, an illuminant having a wide area is used to assure the levelling and, recently, a levelling control system has been used to assure two foci or more.

Semiconductor devices are becoming increasingly integrated. In both memory and non-memory fields, a stack structure has been used to increase the integration level. As the integration level increases, the stack structure becomes more complex. When a semiconductor integrated circuit having a complex stack structure is fabricated, an exposure apparatus must overcome different step heights in the complex stack structure so that the pattern has a consistent focus. If the exposure apparatus patterns respectively different foci, defective patterns are formed and production of the to semiconductor device becomes impossible. A conventional exposure apparatus for exposing a semiconductor device with this stack structure uses a focussing system in which the wafer surface is focussed by a capacitor or laser.

Figure 1A:
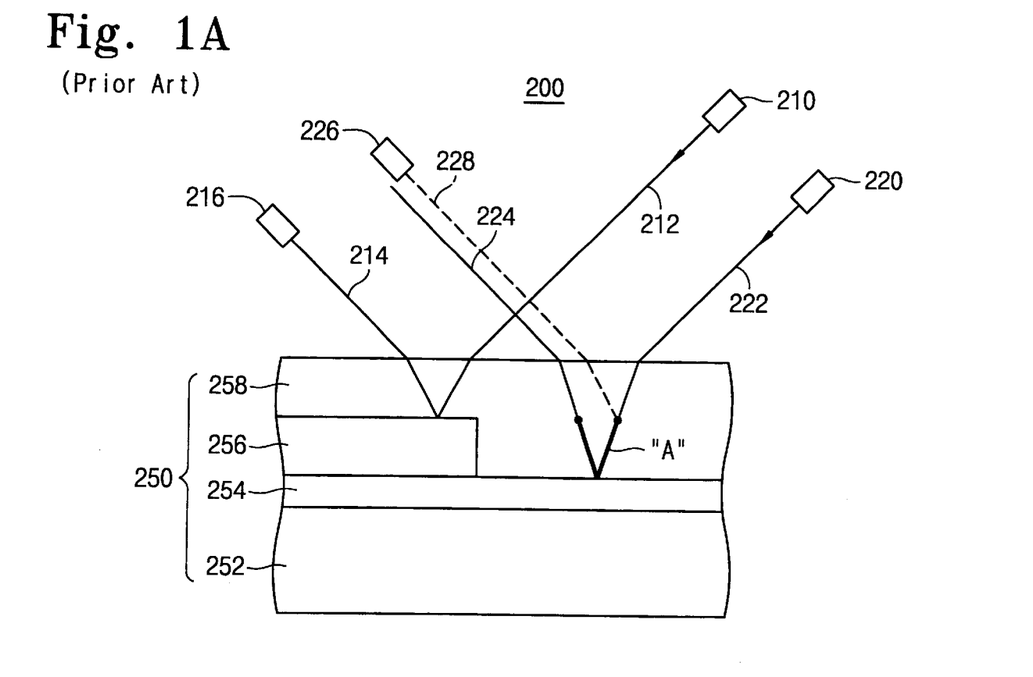
FIGS. 1A–1B are diagrams illustrating a conventional focussing method and system.
Figure 1B:
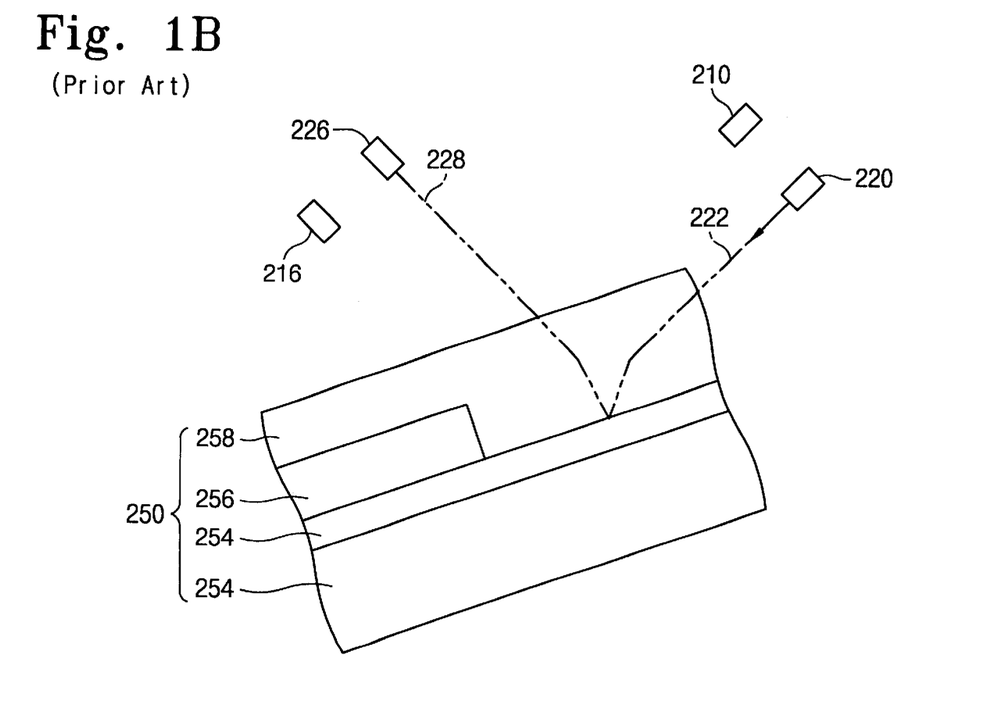

Referring to FIGS. 1A–1B, a conventional focussing system 200 assuring two foci or more has at least two light generating elements 210 and 220 and two light receiving elements 216 and 226. An incident angle (measured with respect to a vertical reference perpendicular to the plane of a wafer surface) of a first light 212 and a second light 222 created at the conventional light generating elements 210 and 220 is about 45°–60°, and transmittance of the first light 212 and the second light 222 is 80% or more. This conventional focussing system 200 detects a first reflective light 214 and a second reflective light 224 that are reflected at a first layer 256 and a second layer 254, respectively, which are stacked on a substrate 252 of a semiconductor wafer 250, to control focussing and levelling between the semiconductor wafer 250 and an optical system (not shown) for performing an exposure process. The first reflective light 214 and the second reflective light 224 penetrate a photoresist layer 258 of the semiconductor wafer 250 and then are reflected from the first layer 256 and the second layer 254, respectively. At this time, there is a step height difference between the first layer 256 and the second layer 254. Accordingly, while confirming a focus thereof, a light path difference "A" is created, as shown by the second reflective light 224 reflected at the second layer 254 in comparison with the first reflective light 214. Reference numeral 228 indicates the light path that would have resulted if there were no step height difference in the successive layers of the structure. In the conventional focussing system 200, as shown in FIG. 1B, the position of the semiconductor wafer 250 is controlled to overcome this light path difference between the first reflective light 214 and the second reflective light 224. However, this leads to incorrect levelling.

In other words, in a conventional focussing method and system, focussing and levelling are controlled by detecting a reflective light that penetrates a photoresist layer and then is reflected from a reflection layer such as a metallic layer and a poly layer formed under the photoresist layer. However, this method and system lead to incorrect levelling of a fixed focus area.

Moreover, achieving an adequate focus is made more difficult in the conventional focussing method and system because light (not shown) reflected from a surface of the photoresist layer 258 serves as noise which influences the reflective lights 214 and 224.

In the conventional focussing method and system, the step height difference created by a complex stack structure produces defective patterns. Particularly, in a focussing system assuring two foci or more by means of a laser, a stack structure to generates asymmetric or incorrect focus, preventing a consistent focus in a fixed area from being obtained. When the fixed area is exposed, a defocus is created and defective patterns are formed.

SUMMARY OF THE INVENTION

An object of the invention is to provide a focussing method and system which can obtain stable focussing and levelling of a substrate that has a complex stack structure and is exposed in an exposure apparatus for producing semiconductor elements and liquid crystal elements.

Another object of the invention is to provide a focussing method and system which can ensure a consistent focus in a fixed area of a semiconductor wafer having a stack structure in a focussing system confirming two foci by means of a laser.

According to a feature of the invention, there is provided a focussing method for controlling a distance between an optical system and a substrate in an exposure apparatus. The substrate has a surface coated with a coating layer so as to form a pattern on the substrate. The method comprises transmitting a light for detecting a focus on the substrate, wherein the light is transmitted at an incident angle at which an amount of light reflected from the surface of the coating layer is larger than an amount of light penetrating the surface of the coating layer; detecting the light reflected from the surface of the coating layer on the substrate; and controlling a position of the substrate in response to the detected light, thereby obtaining a consistent focus in a fixed area along the surface thereof.

In this embodiment, an incident angle of the light is equal to or greater than an angle at which reflectance of a component vertically entering the surface of a photoresist layer is higher than transmittance thereof.

In this embodiment, an incident angle of the light is equal to or greater than an angle at which reflectance of a component horizontally entering the surface of a photoresist layer is higher than transmittance thereof.

According to another feature of the invention, there is provided a focussing system for confirming two foci or more when an exposure process is performed on a semiconductor wafer having a stack structure. The system includes a light source for creating a light for detecting a focus of the semiconductor wafer, and then transmitting the light at an incident angle at which an amount of light reflected from the surface of the photoresist layer is larger than an amount of light penetrating the surface of the photoresist layer. A detection part detects the reflected light and then generates a detection signal. A control part controls a position of the semiconductor wafer in response to the detection signal generated at the detection part and confirms two foci or more, thereby providing a consistent focus in a fixed area of the semiconductor wafer.

In a focussing method and system of the invention, a light for measuring a focus is transmitted to a wafer with a fixed incident angle having a high reflectance and then light reflected from the surface of the photoresist layer on a semiconductor wafer is detected, thereby controlling a focus. Since a focus can be maintained in a complex stack structure on a semiconductor wafer, improper focussing and levelling is prevented during an exposure process, thereby assuring good patterning. In particular, it is possible to stably assure a consistent focus in a fixed area of a semiconductor wafer having a stack structure in a focussing system confirming two foci or more by means of a laser.

BRIEF DESCRIPTION OF THE ATTACHED DRAWINGS

The accompanying drawings, which are included to provide a further understanding of the invention and are incorporated in and constitute a part of this specification illustrate an embodiment of the invention, in which.

DETAILED DESCRIPTION OF PREFERRED EMBODIMENTS

Hereinafter, an embodiment of the invention will be described more fully with reference to the accompanying drawings. In the drawings, like reference numerals denote like elements.

Figure 2:
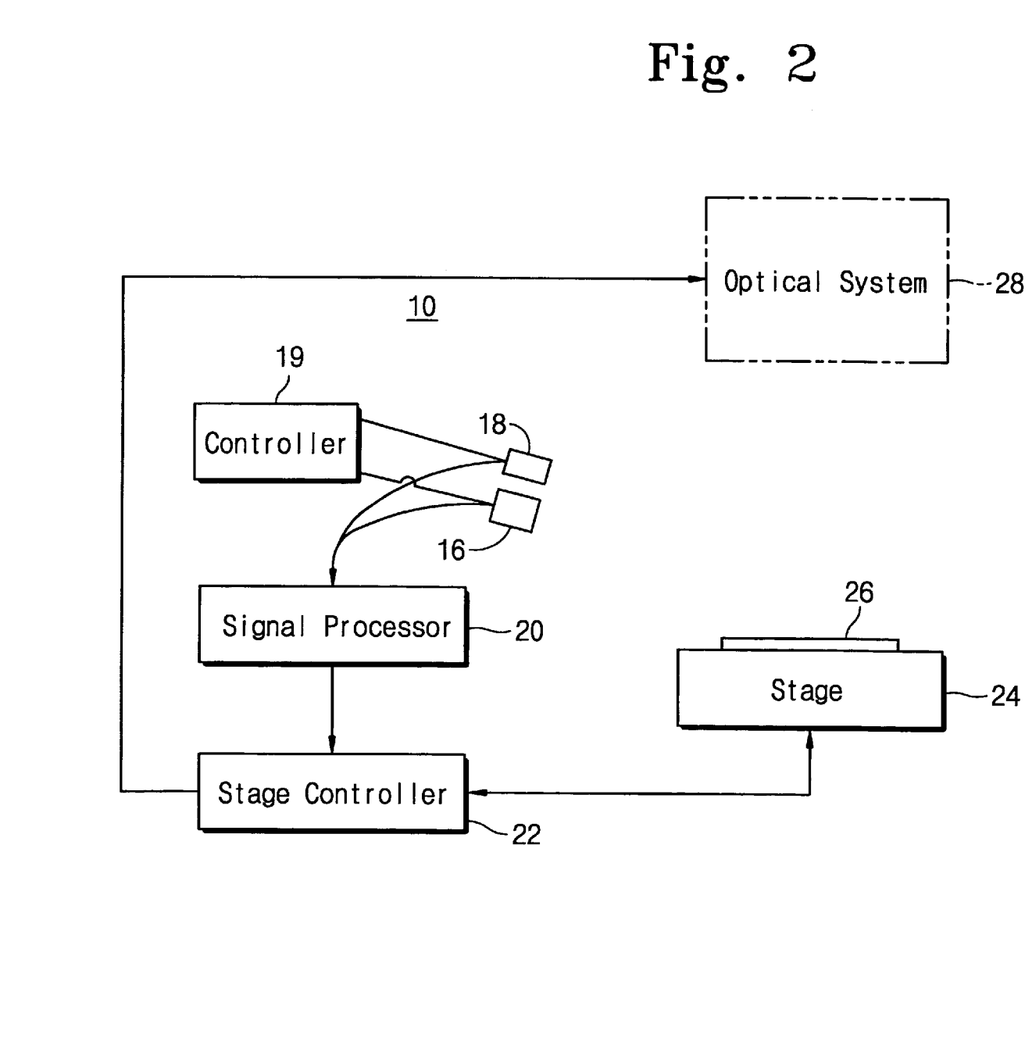
FIG. 2 is a schematic view showing a configuration of a focussing system in accordance with an embodiment of the invention.

Referring to FIG. 2, a focussing system 10 of this invention is mounted in an exposure apparatus (not shown) and is able to use a capacitor and laser (not shown). In this embodiment, the focussing system 10 uses the laser and confirms two foci or more. The focussing system 10 is used to control a distance between an optical system 28 and a stage 24. The optical system 28 is used to expose a desirable pattern on a photoresist layer that is coated over a semiconductor wafer 26 located on the stage 24. That is, the focussing system 10 is used to control focussing and levelling in the exposure apparatus so as to perform an exposure process.

The focussing system 10 conventionally comprises a source part, a detection part, and a control part. The source part includes a first light generating element 12, a second light generating element 14, and a controller 19. Of course, the first and second light generating elements 12, 14 may be comprised of any suitable illuminating device for generating a light. The first light generating element 12 and the second light generating element 14 are mounted such that an incident angle of the light can be controlled by the controller 19.

The detection part has a first light receiving element 16 and a second light receiving element 18, respectively corresponding to the first light generating element 12 and the second light generating element 14, a signal processor 20, and a controller 19'. Similar to the first light generating element 12 and the second light generating element 14, the positioning of the first light receiving element 16 and the second light receiving element 18 can be automatically varied by the controller 19'. Since the light generating elements 12 and 14 and the light receiving elements 16 and 18 are interlocked with each other, the controllers 19 and 19' may be interlocked with each other, or a single controller may be used to control the light generating elements 12 and to 14 and the light receiving elements 16 and 18.

As described in detail later, the focussing system 10 of this invention may use three light generating elements and three corresponding light receiving elements when the semiconductor wafer 26 is in a paused state. In addition, four light generating elements and four corresponding light receiving elements may be used when the semiconductor wafer 26 is in a moving or scanning state.

Light generated from the first light generating element 12 and the second light generating element 14 is first radiated at an incident angle toward the semiconductor wafer 26 on the stage 24, then reflected from the semiconductor wafer 26, and thereafter transmitted to the first light receiving element 16 and the second light receiving element 18. When the light is detected at the first and second light receiving elements 16 and 18, a signal processor 20 of the detection part outputs a signal corresponding to an amount of light detected and then transmits the signal to the control part. The control part includes a stage controller 22 and a stage 24. The stage controller 22 receives the signal transmitted from the signal processor 20 and then controls movement of the stage 24, thereby controlling a focus for performing an exposure process.

Figure 3:
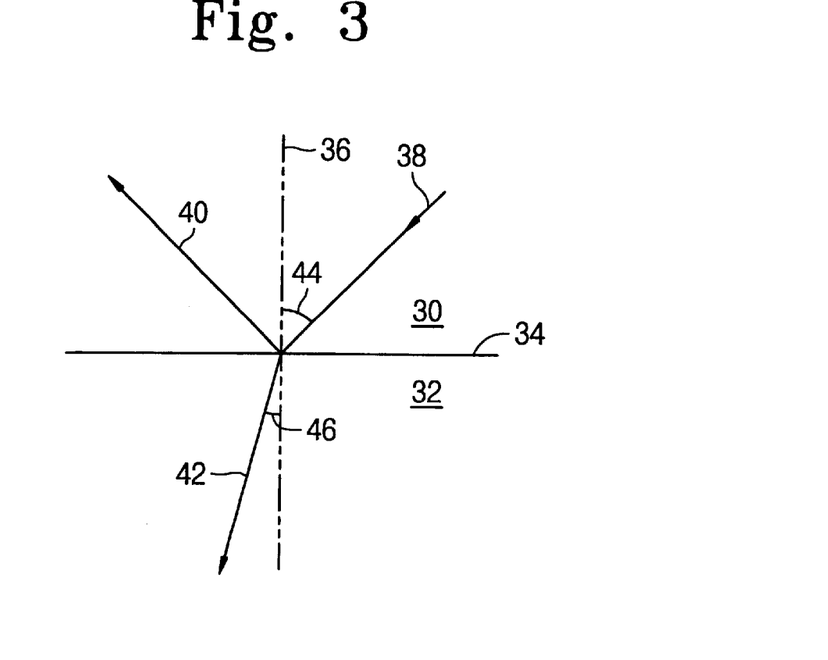
FIG. 3 is a schematic view illustrating a focussing method of the invention, showing a light path at two media having different refractive indices.
Figure 4A:
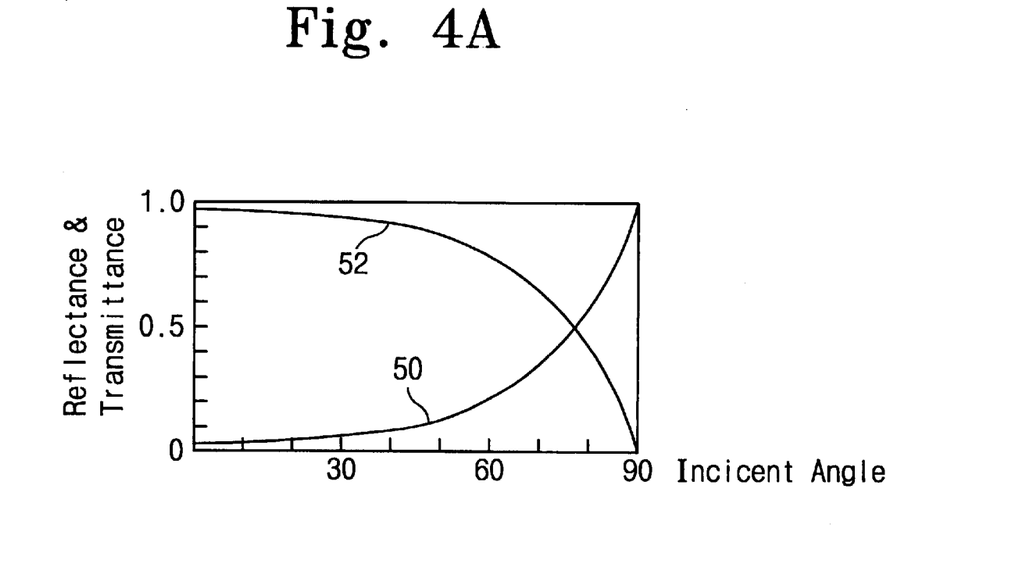
FIG. 4A is a graph showing a relationship between reflectance and transmittance of a vertical element of the incident light of FIG. 2.
Figure 4B:
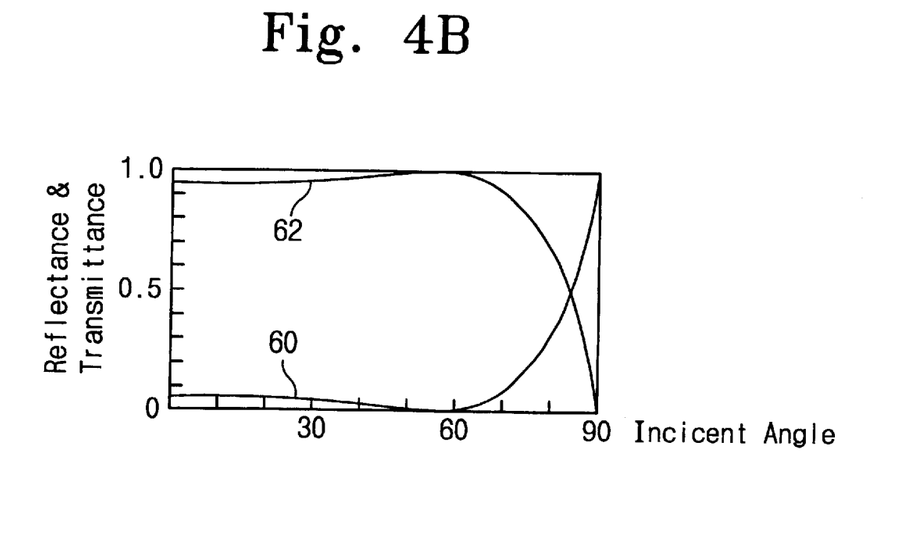
FIG. 4B is a graph showing a relationship between reflectance and transmittance of a horizontal element of the incident light of FIG. 2.

Referring to FIGS. 3, 4A and 4B, when an incident light 38 passes from a low refractive index medium 30 to a high refractive index medium 32, a transmission angle 46 is generally smaller than an incident angle 44. The strength of a transmission light 42 and a reflective light 40 is dependent upon the incident angle 44 of the incident light 38. The incident angle 44 and the transmission angle 46 are measured with respect to a vertical reference perpendicular to the plane of the wafer surface. Assuming that 1.5 is the ratio of a refractive index of a medium 30 where the incident light 38 enters to that of a medium 32 where the transmission light 42 proceeds, the incident light 38 can be analysed in terms of vertical and horizontal components at the interface 34, as shown in FIGS. 4A–4B. That is, the incident light is divided into one component vertically entering the interface 34 and another component horizontally entering the interface 34, and FIGS. 4A–4B are graphs analyzing these two components with respect to the two media 30 and 32. Herein, FIG. 4A illustrates reflectance 50 and transmittance 52 of the vertical component and FIG. 4B illustrates reflectance 60 and transmittance 62 of the horizontal component.

As can be seen in FIG. 4A, when the incident angle 44 is about 75° or more, the reflectance 50 will be higher than the transmittance 52. Further, as can be seen in FIG. 4B, when the incident angle 44 is about 80° or more, the reflectance 60 will be higher than the transmittance 62. That is, when the incident angle 44 of the incident light 38 is maintained at an angle range of about 75° to about 90°, reflectance of the incident light 38 will be higher than transmittance thereof. In this focussing system 10, as can to be seen in FIG. 5, the incident angles 90 and 92 of the incident lights 80 and 84 have an angle in this range, thereby making it possible that reflectance of the vertical and horizontal components is higher than transmittance thereof.

Figure 5:
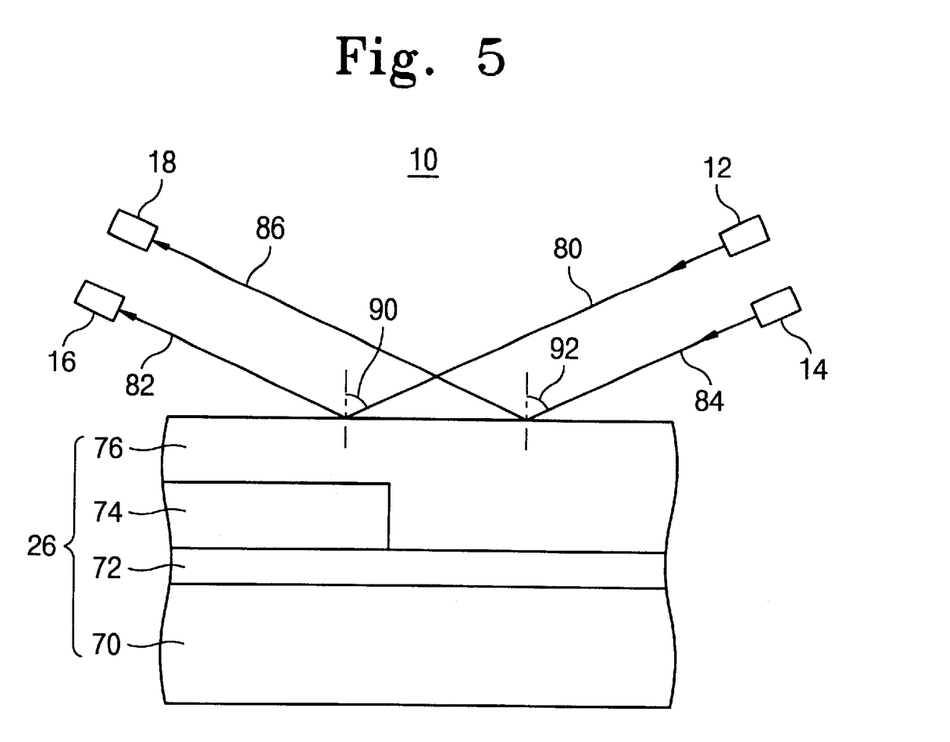
FIG. 5 is a schematic view illustrating a light path for measuring a focus in a focussing method and system of the invention.

Referring to FIG. 5, a focussing system 10 assuring two foci or more according to the invention has a first light generating element 12 and a second light generating element 14. A first incident light 80 and a second incident light 84 are generated from the first light generating element 12 and the second light generating element 14, respectively, and then are radiated toward a semiconductor wafer 26. At this time, circuits are stacked on the semiconductor wafer 26. A first layer 72 and a second layer 74 are stacked on a substrate 70 of the semiconductor wafer 26. A photoresist layer 76 coats the first layer 72 and the second layer 74. There is a step height difference between the first layer 72 and the second layer 74.

The focussing system 10 is used to focus a first reflective light 82 and a second reflective light 86, which are reflected at the surface of the photoresist layer 76 on the surface of the semiconductor wafer 26. That is, as mentioned above, the first incident light 80 and the second incident light 84 have sufficient incident angles 90 and 92 such the reflectance is higher than the transmittance. The incident angles 90 and 92 can be controlled by setting a stagger angle of the first and the second light generating elements 12 and 14. To do so, the first and the second light generating elements 12 and 14 are supported so as to be controlled at random angles with respect to the semiconductor wafer 26. That is, a structure (not shown) of the first and the second light generating elements 12 and 14 is such that the incident angles 90 and 92 of the first and second incident lights 80 and 84 are controlled in a range of about 75° to about 90°. Notice that with such a high incidence angle, the reflected light is not affected by the step height difference between first layer 72 and second layer 74.

Figure 6A:
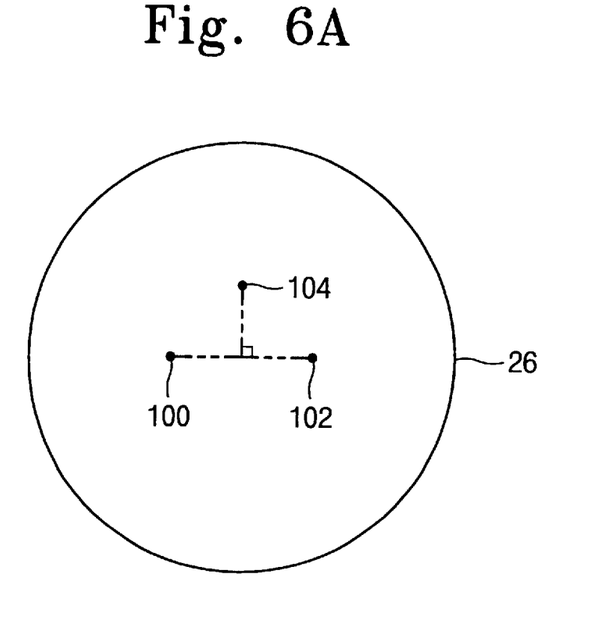
FIGS. 6A–6B are diagrams illustrating a method for confirming a focus in line with a state of a semiconductor wafer in a focussing system confirming two foci or more by means of a laser in accordance with embodiments of the invention.
Figure 6B:
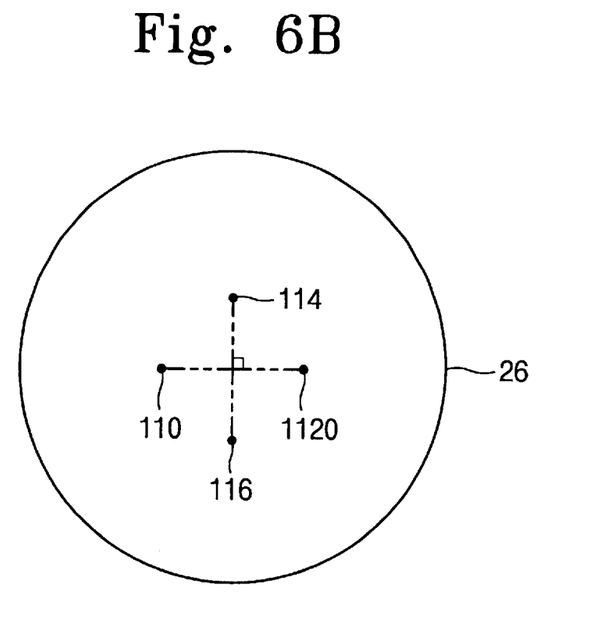

Referring to FIGS. 6A–6B, the focussing system in accordance with an embodiment of the invention is used during an exposure process in which a semiconductor wafer 26 is exposed in a paused state using three light generating elements (FIG. 6A), or in a scanning state using four light generating elements (FIG. 6B). Because the semiconductor wafer 26 is moving along in the directions of X, Y, and Z axes and also rotating so as to obtain focussing and levelling, it is necessary that a focus be planarly obtained for correct levelling.

As shown in FIG. 6A, when the semiconductor wafer 26 is in a paused state, three foci 100, 102, and 104 are obtained. Two of the foci 100 and 102 define an line, and the third focus 104 is offset perpendicular to the center point of that line by a predetermined distance. Stable levelling can be obtained by the three foci 100, 102, and 104. For this, a source part (not shown) of the foregoing focussing system includes three light generating elements and a detection part (not shown) thereof includes three corresponding light receiving elements, respectively.

As shown in FIG. 6B, when the semiconductor wafer 26 is in a scanning state, four foci 110, 112, 114, and 116 are obtained. Two of the foci 114 and 116 define one line, and the other two foci 110 and 112 define a second line which intersects the first line perpendicularly at the center point of the first line. Stable levelling can be obtained by the four foci 110, 112, 114, and 116. For this, a source part (not shown) of the foregoing focussing system includes four light generating elements and a detection part (not shown) thereof includes four corresponding light receiving elements, respectively. Of course, any plurality of light generating elements and a corresponding plurality of light receiving elements may be employed in the respective source and detection parts.

A focussing method and system of this invention transmit an incident light to a surface in a range of incident angles such that reflectance of the incident light is higher than transmittance thereof. That is, the focussing method and system set an incident angle such that reflectance of an incident light is higher than transmittance. Since the focussing method and system obtain information about a surface of a photoresist layer, defective foci resulting from a stack structure can be minimized to obtain a consistent fixed focus. In an alignment system confirming two foci or more, refractive indices of a photoresist layer and air are used to determine the proper incident angle for the incident light radiated toward the semiconductor wafer to stably assure two fixed foci or more.

Applying the present invention, a stable focus can be maintained in a complex structure on a semiconductor wafer. As a result, defective focussing and levelling can be suppressed to assure good patterning when an exposure process is carried out. In particular, it is possible to stably assure a consistent focus in a fixed area of a semiconductor wafer having a stack structure in a focussing system confirming two foci or more by means of a laser.

The present invention is not limited to the embodiments set forth above, and it is clearly understood that many variations may be made within the scope of the present invention by anyone of skill in the art.

What is claimed is:

1. A focussing method for confirming two or more foci on a semiconductor wafer in an exposure apparatus, the semiconductor wafer having a stack structure and a coating of a photoresist layer, the focussing method comprising:

transmitting a light to the semiconductor wafer for detecting a focus, wherein the light is transmitted at an incident angle at which an amount of light reflected from a surface of the photoresist layer is larger than an amount of light penetrating a surface of the photoresist layer;

detecting the light reflected from the surface of the photoresist layer; and controlling a position of the semiconductor wafer in response to the light detected and confirming two or more foci, wherein a consistent focus is obtained in a fixed area of the semiconductor wafer;

wherein the focussing method confirms three foci when the semiconductor wafer is in a paused state, two of the three foci defining a line on a surface of the wafer, a third of the three foci being offset perpendicular to a center point of that line by a predetermined distance.

2. A focussing method for confirming two or more foci on a semiconductor wafer in an exposure apparatus, the semiconductor wafer having a stack structure and a coating of a photoresist layer, the focussing method comprising:

transmitting a light to the semiconductor wafer for detecting a focus, wherein the light is transmitted at an incident angle at which an amount of light reflected from a surface of the photoresist layer is larger than an amount of light penetrating a surface of the photoresist layer;

detecting the light reflected from the surface of the photoresist layer; and controlling a position of the semiconductor wafer in response to the light detected and confirming two or more foci, wherein a consistent focus is obtained in a fixed area of the semiconductor wafer;

wherein the focussing method confirms four foci when the semiconductor wafer is in a scanning state, a first pair of the four foci defining one line, and a second pair of the four foci defining a second line which intersects the first line perpendicularly at a center point of the first line.

3. A focussing system for confirming two or more foci on a semiconductor wafer in an exposure apparatus, the semiconductor wafer having a stack structure and a coating of a photoresist layer, the focussing system comprising:

a source part for creating and transmitting a light to the semiconductor wafer at an incident angle at which an amount of light reflected from the photoresist layer is larger than an amount of light penetrating a surface of the photoresist layer;

a detection part for detecting light reflected from the surface of the photoresist layer and then generating a detection signal; and a control part for controlling a position of the semiconductor wafer in response to the detection signal generated and confirming two or more foci, wherein a consistent focus is obtained in a fixed area of the semiconductor wafer;

wherein the source part comprises three light generating elements and the detection part comprises three light receiving elements corresponding to the light generating elements of the source part, respectively, wherein the three light generating elements emit light which is incident on the surface of the photoresist layer at three foci, the three foci being disposed relative to one another such that two of the three foci define a line on the surface of the photoresist layer, and a third of the three foci is offset perpendicular to a center point of that line by a predetermined distance, thereby confirming three foci when the semiconductor wafer is in a paused state.

4. A focussing system for confirming two or more foci on a semiconductor wafer in an exposure apparatus, the semiconductor wafer having a stack structure and a coating of a photoresist layer, the focussing system comprising:

a source part for creating and transmitting a light to the semiconductor wafer at an incident angle at which an amount of light reflected from the photoresist layer is larger than an amount of light penetrating a surface of the photoresist layer;

a detection part for detecting light reflected from the surface of the photoresist layer and then generating a detection signal; and a control part for controlling a position of the semiconductor wafer in response to the detection signal generated and confirming two or more foci, wherein a consistent focus is obtained in a fixed area of the semiconductor wafer;

wherein the source part comprises four light generating elements and the detection part comprises four light receiving elements corresponding to the light generating elements of the source part, respectively, wherein the four light generating elements emit light which is incident on the surface of the photoresist layer at four foci, the four foci being disposed relative to one another such that a first pair of the four foci define one line, and a second pair of the four foci define a second line which intersects the first line perpendicularly at a center point of the first line, thereby confirming four foci when the semiconductor wafer is in a scanning state.

5. A method of focussing an optical system of an exposure apparatus on a photoresist layer of a semiconductor wafer having a multi-layered structure coated by the photoresist layer; said method comprising transmitting light onto the upper surface of the photoresist layer, wherein said transmitting comprises directing two discrete beams of light onto the upper surface at first and second spaced-apart locations thereon representing two foci, respectively, and each at an angle of incidence that causes more of the beam of light to be reflected at said surface than refracted by the photoresist;

detecting the beams of light reflected from said locations on the upper surface of the photoresist layer, respectively; and controlling the position of the semiconductor wafer relative to the optical system of the exposure apparatus in response to the detecting of the reflected light;

wherein the transmitting of the light onto the upper surface of the photoresist layer is carried out while the semiconductor wafer is held still, and further comprises directing a third beam of light onto the upper surface of the photoresist layer at a third location offset perpendicular from the center of a line connecting said first and second locations.

6. A method of focussing an optical system of an exposure apparatus on a photoresist layer of a semiconductor wafer having a multi-layered structure coated by the photoresist layer, ad method comprising:

transmitting light onto the upper surface of the photoresist layer, wherein said transmitting comprises directing two discrete beams of light onto the upper surface at first and second spaced-apart locations thereon representing two foci, respectively, and each at an angle of incidence that causes more of the beam of light to be reflected at said surface than refracted by the photoresist;

detecting the beams of light reflected from said locations on the upper surface of the photoresist layer, respectively;

controlling the position of the semiconductor wafer relative to the optical system of the exposure apparatus in response to the detecting of the reflected light; and scanning the transmitted light across the upper surface of the photoresist layer;

wherein he transmitting of the light onto the upper surface of the photoresist layer further comprises directing third and fourth beams of light onto the upper surface of the photoresist layer at third and fourth locations spaced apart from one another along a second line perpendicular to and intersecting the center of a first line connecting said first and second spaced-apart locations.

7. In combination with an exposure apparatus having an optical system for exposing a substrate and a stage used to support the substrate during its exposure, a focussing system comprising:

a source part that produces first and second discrete beams of light and transmits the beams of light toward the stage generally parallel to one another in such directions that the beams of light each subtend an angle in a range of about 75° to about 90° with respect to a plane normal to an upper surface of said stage, wherein the first and second beams of discrete light will impinge a substrate, supported on the stage, at first and second spaced-apart locations thereon representing two foci, respectively;

a detection part positioned to detect the fist and second beams of light reflected from the substrate supported on the stage; and a processor operatively connected to said detection part and to said stage so as to control the position of said stage based on the detection of the light by said detection part;

wherein said source part comprises first, second and third discrete light sources, and said detection part comprises three light detectors associated with said light sources, respectively, said first and second discrete light sources producing said first and second beams of light, respectively, said third light source producing a third beam of light, and said source part directing the third beam of light toward said stage in such a direction that the third beam of light will impinge the substrate, supported on the stage, at a third location offset perpendicular from the center of a line connecting said first and second locations.

8. In combination with an exposure apparatus having an optical system for exposing a substrate and a stage used to support the substrate during its exposure, a focussing system comprising:

a source part that produces first and second discrete beams of light and transmits the beams of light toward the stage generally parallel to one another in such directions that the beams of light each subtend an angle in a range of about 75° to about 90° with respect to a plane normal to an upper surface of said stage, wherein the first and second beams of discrete light will impinge a substrate, supported on the stage, at first and second spaced-apart locations thereon representing two foci, respectively;

a detection part positioned to detect the first and second beams of light reflected from the substrate supported on the stage; and a processor operatively connected to said detection part and to said stage so as to control the position of said stage based on the detection of the light by said detection part;

wherein said source pat comprises first, second, third and fourth discrete light sources, and said detection part comprises four light detectors associated with said light sources, respectively, said first and second discrete light sources producing said first and second beams of light, respectively, said third and fourth light sources producing third and fourth discrete beams of light, and said source part directing the third and fourth beams of light toward said stage in such directions that the third and fourth beams of light will impinge the substrate, supported on the stage, at third and fourth locations spaced apart from one another along a second line perpendicular to and intersecting the center of a first line connecting said first and second spaced-apart locations.

* * * * *